(12) United States Patent
Koo et al.

(10) Patent No.: US 10,356,953 B2
(45) Date of Patent: Jul. 16, 2019

(54) BOOTH APPARATUS FOR SUPPLYING COOLING AIR

(71) Applicant: NAVER Business Platform Corporation, Seongnam-si (KR)

(72) Inventors: Ji Hyun Koo, Seongnam-si (KR); Sang Min Roh, Seongnam-si (KR); Jaepil Kim, Seongnam-si (KR)

(73) Assignee: NAVER Business Platform Corporation, Seongnam-si (KR)

( * ) Notice: Subject to any disclaimer, the term of this patent is extended or adjusted under 35 U.S.C. 154(b) by 129 days.

(21) Appl. No.: 14/564,400

(22) Filed: Dec. 9, 2014

(65) Prior Publication Data

US 2015/0163963 A1      Jun. 11, 2015

(30) Foreign Application Priority Data

Dec. 9, 2013 (KR) .................. 20-2013-0010167 U

(51) Int. Cl.
*H05K 7/20* (2006.01)

(52) U.S. Cl.
CPC ..... *H05K 7/20736* (2013.01); *H05K 7/20145* (2013.01); *H05K 7/20745* (2013.01)

(58) Field of Classification Search
CPC ................................................ H05K 7/20736
USPC ....................................................... 165/122
See application file for complete search history.

(56) References Cited

U.S. PATENT DOCUMENTS

| | | | | |
|---|---|---|---|---|
| 4,419,938 A | * | 12/1983 | Kaut | A47B 47/05 108/101 |
| 4,449,764 A | * | 5/1984 | Hastings | E05G 5/02 261/106 |
| 4,589,712 A | * | 5/1986 | Hastings | E05G 5/02 261/106 |
| 4,728,160 A | * | 3/1988 | Mondor | H05K 7/1429 312/236 |
| 5,216,579 A | * | 6/1993 | Basara | G06F 1/184 174/481 |
| 5,228,762 A | * | 7/1993 | Mascrier | H02B 1/01 312/265.1 |

(Continued)

FOREIGN PATENT DOCUMENTS

| | | |
|---|---|---|
| JP | 2004-055883 A | 2/2004 |
| JP | 2005-172309 | 6/2005 |
| JP | 2011-238764 A | 11/2011 |

OTHER PUBLICATIONS

Korean Office Action issued in corresponding to Korean Patent App. No. 20-2014-0008058; dated Feb. 6, 2017.

(Continued)

*Primary Examiner* — Robert J Hoffberg

(74) *Attorney, Agent, or Firm* — Greer Burns & Crain, Ltd.

(57) ABSTRACT

A cooling air supplying booth apparatus for supplying cooling air to pieces of equipment in a rack unit includes a first frame and a plurality of plates. The first frame forms edges of a cuboid. The plates are fixed to the first frame and disposed at four of sides of the cuboid and form a cooling air moving path. A cooling plate includes at least one fan and is disposed at the bottom of the first frame opposite the top side of the first frame. Cooling air is supplied to the cooling air moving path through the fan, and supplied to the equipment through an outlet side in the cooling air supplying booth apparatus.

3 Claims, 4 Drawing Sheets

(56) References Cited

U.S. PATENT DOCUMENTS

| | | | | |
|---|---|---|---|---|
| 6,151,210 A * | 11/2000 | Cercioglu | ........... | H05K 7/20572 165/104.33 |
| 6,535,382 B2 * | 3/2003 | Bishop | ............... | H05K 7/20836 312/223.1 |
| 6,592,449 B2 * | 7/2003 | Cipolla | ..................... | G06F 9/52 454/184 |
| 6,616,524 B2 * | 9/2003 | Storck, Jr. | ................. | F24F 7/06 361/678 |
| 6,622,425 B2 * | 9/2003 | Shepherd | ............... | A01G 9/028 47/17 |
| 6,668,565 B1 * | 12/2003 | Johnson | ............. | H05K 7/20581 361/695 |
| 6,775,137 B2 * | 8/2004 | Chu | ................... | H05K 7/20754 165/120 |
| 6,791,836 B2 * | 9/2004 | Cipolla | ..................... | G06F 9/52 361/679.48 |
| 6,813,152 B2 * | 11/2004 | Perazzo | ............. | H05K 7/20581 165/121 |
| 6,909,611 B2 * | 6/2005 | Smith | ..................... | G06F 1/181 307/43 |
| 7,036,270 B1 * | 5/2006 | Shepherd | ............... | A01G 9/028 47/18 |
| 7,170,745 B2 * | 1/2007 | Bash | ........................ | G06F 1/206 165/80.3 |
| 7,177,148 B2 * | 2/2007 | Nakata | ..................... | H02B 1/28 174/16.1 |
| 7,274,573 B2 * | 9/2007 | Sevekivi | .............. | H05K 7/1432 211/183 |
| 7,372,695 B2 * | 5/2008 | Coglitore | ................ | G06F 1/20 361/679.48 |
| 7,420,805 B2 * | 9/2008 | Smith | ................... | H05K 7/1488 165/104.33 |
| 7,679,908 B2 * | 3/2010 | Yeh | ........................ | G06F 1/181 165/104.33 |
| 7,965,504 B2 * | 6/2011 | Hamlin | .............. | H05K 7/20572 165/80.2 |
| 8,009,430 B2 * | 8/2011 | Claassen | ............ | H05K 7/20736 312/223.2 |
| 8,047,904 B2 * | 11/2011 | Yates | ................... | B65D 88/745 454/118 |
| 8,154,870 B1 * | 4/2012 | Czamara | .............. | H05K 7/20736 361/694 |
| 8,251,785 B2 * | 8/2012 | Schmitt | ................. | H05K 7/1497 361/695 |
| 8,567,387 B2 * | 10/2013 | Binzer | ...................... | F23L 1/00 126/521 |
| 8,626,346 B2 * | 1/2014 | Archibald | ......... | H05K 7/20745 700/278 |
| 8,743,543 B2 * | 6/2014 | Clidaras | .................... | G06F 1/20 165/80.4 |
| 8,947,879 B2 * | 2/2015 | Broome | ............... | H05K 7/1497 165/104.33 |
| 9,008,079 B2 * | 4/2015 | Davis | ..................... | H04L 45/60 370/384 |
| 9,054,990 B2 * | 6/2015 | Davis | ..................... | H04L 45/60 |
| 9,069,929 B2 * | 6/2015 | Borland | .............. | G06F 15/7803 |
| 9,075,655 B2 * | 7/2015 | Davis | ..................... | H04L 45/60 |
| 9,077,654 B2 * | 7/2015 | Davis | ..................... | H04L 45/60 |
| 9,092,594 B2 * | 7/2015 | Borland | .............. | G06F 15/7803 |
| 9,218,028 B2 * | 12/2015 | Whang | ..................... | G06F 3/00 |
| 9,243,943 B2 * | 1/2016 | Moore | .................... | G01F 1/699 |
| 9,262,225 B2 * | 2/2016 | Davis | ..................... | H04L 45/60 |
| 9,311,269 B2 * | 4/2016 | Davis | ................... | G06F 15/177 |
| 2005/0047087 A1 * | 3/2005 | Espinoza-Ibarra | ... | F04D 29/329 361/695 |
| 2005/0225936 A1 * | 10/2005 | Day | ................... | H05K 7/20745 361/679.47 |
| 2005/0237716 A1 * | 10/2005 | Chu | ................... | H05K 7/20736 361/696 |
| 2007/0171613 A1 * | 7/2007 | McMahan | .......... | H05K 7/20736 361/695 |
| 2007/0201210 A1 * | 8/2007 | Chow | ................. | H05K 7/20727 361/704 |
| 2008/0113604 A1 * | 5/2008 | Tufford | ..................... | G06F 1/20 454/187 |
| 2009/0207567 A1 * | 8/2009 | Campbell | ............... | F28D 15/00 361/696 |
| 2010/0041327 A1 * | 2/2010 | Desler | .................... | F24F 1/0007 454/184 |
| 2011/0209852 A1 * | 9/2011 | Enlund | ............ | H05K 7/20745 165/104.11 |
| 2012/0069514 A1 * | 3/2012 | Ross | ................. | H05K 7/20727 361/679.33 |
| 2012/0192853 A1 * | 8/2012 | Binzer | ................. | F24C 15/002 126/512 |
| 2012/0247750 A1 * | 10/2012 | Kobayashi | ......... | H05K 7/20836 165/287 |
| 2013/0088833 A1 * | 4/2013 | Cox | ................... | H05K 7/20736 361/689 |
| 2014/0148086 A1 * | 5/2014 | Cash | .................. | H05K 7/20145 454/184 |
| 2014/0238639 A1 * | 8/2014 | Ambriz | ............. | H05K 7/20745 165/57 |
| 2014/0240917 A1 * | 8/2014 | Nicolai | ............. | H05K 7/20736 361/679.47 |
| 2016/0260018 A1 * | 9/2016 | Ogawa | ..................... | G06N 5/04 |

OTHER PUBLICATIONS

Rittal IT Cooling, YouTube, Aug. 19, 2011. <URL:https://https://www.youtube.com/watch?v=IsFRt5cgzwk>.

* cited by examiner

BOOTH APPARATUS FOR SUPPLYING COOLING AIR

CROSS-REFERENCE TO RELATED APPLICATIONS

A claim for priority under 35 U.S.C. § 119 is made to Korean Utility Model Application No. 20-2013-0010167 filed Dec. 9, 2013, in the Korean Intellectual Property Office, the entire contents of which are hereby incorporated by reference.

BACKGROUND

The inventive concepts described herein relate to a booth apparatus for supplying cooling air.

A server, network equipment, and enterprise equipment of a data center generate heat. For this reason, the data center that manages the pieces of equipment also manages large-scale equipment for cooling heat.

Cooling air must be supplied to the pieces of equipment to reduce the heat in the data center. In general, a temperature control apparatus is used to make the cooling air.

However, about 50 to 60% of power of the data center is consumed to drive the temperature control apparatus and pieces of equipment associated with the temperature control apparatus.

A heat cooling technique where external cooling air is supplied to a service room to cool the pieces of equipment is used to reduce energy consumed to cool the data center.

In any heat cooling techniques, it is important to cool various pieces of equipment of the data center efficiently.

SUMMARY

A cooling air supplying booth apparatus for supplying cooling air to an equipment in a rack unit is provided. The cooling air supplying booth apparatus includes a first frame, and a plurality of plates. The first frame forms edges of a cuboid. The plates are fixed to the first frame. The plates are disposed at four of sides of the cuboid and form a cooling air moving path. A cooling plate includes at least one fan and is disposed to correspond to a first side of first and second sides, the remaining sides other than the four sides where the plates are disposed. Cooling air is supplied to the cooling air moving path through the fan, and supplied to the apparatus through the second side.

The cooling plate may be inclined toward a top of the first side at a predetermined angle.

The cooling air supplying booth apparatus may further include at least one support frame that is configured such that at least one of sides perpendicular to the first side traverses in parallel with the first side.

The cooling air supplying booth apparatus may further include a control unit that controls the operation of the at least one fan.

The control unit may include at least one of a module for displaying information about a current operating state of the at least one fan and a module for changing a control reference value about the at least one fan.

The cooling air supplying booth apparatus may further include at least one temperature sensor that is joined with at least one of the first frame and at least one support frame connected with the first frame. The control unit may include at least one of a module for displaying information about a temperature of the cooing air moving path depending on a received output signal and a module for controlling the at least one fan depending on the output signal.

The cooling air supplying booth apparatus may further include at least one handle that is disposed on a vertical edge of edges forming a front side of the cuboid.

The cooling air supplying booth apparatus may further include at least one wheel that is attached on at least one of edges forming a lower side of the cuboid or on at least one of vertices forming the lower side of the cuboid at the first frame.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
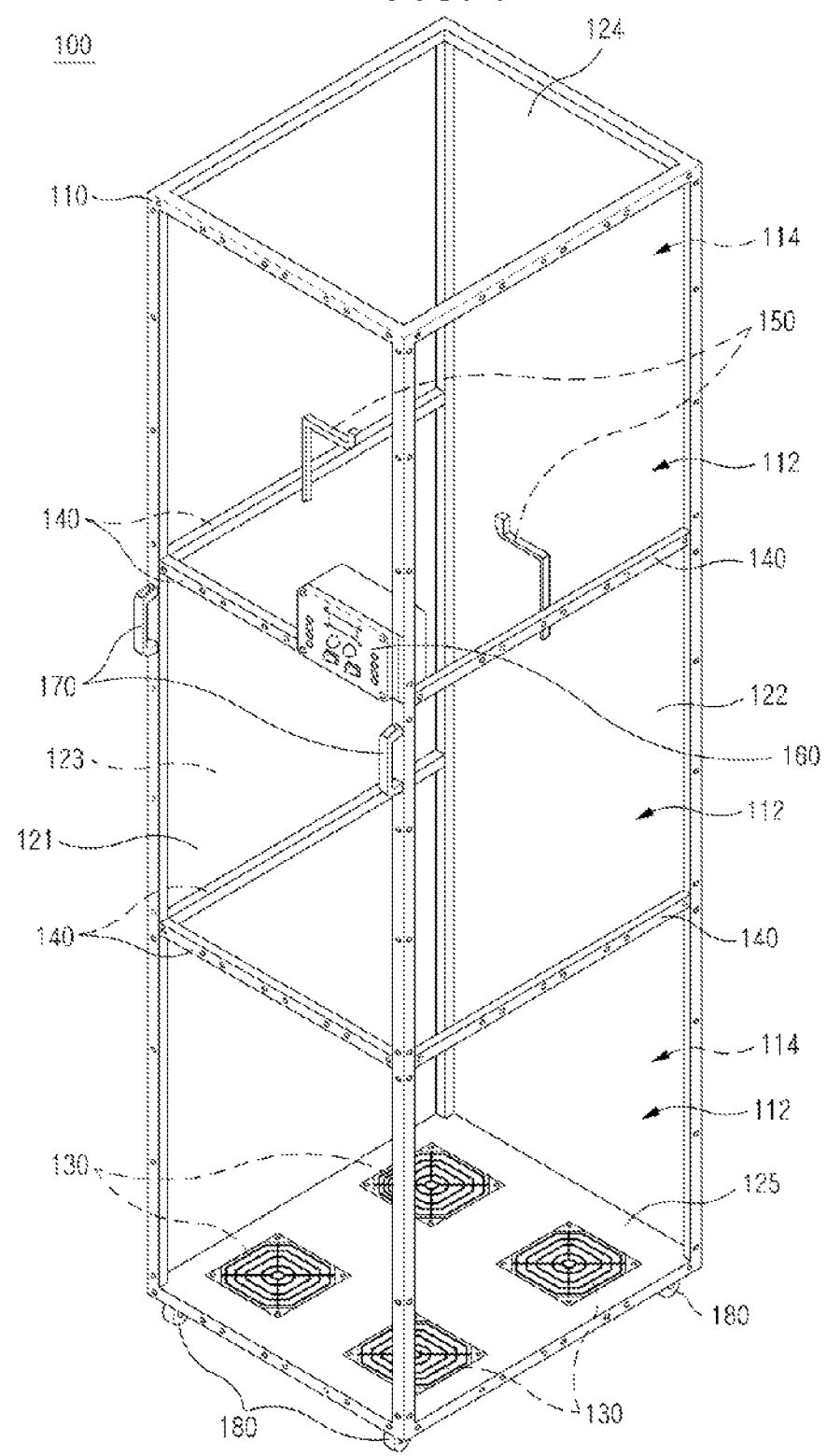
FIG. 1 is a perspective view of a cooling air supplying booth according to an embodiment of the inventive concept.

The embodiments of the present invention or inventive concept will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the present invention to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a perspective view of a cooling air supplying booth according to an embodiment of the inventive concept.

A cooling air supplying booth 100 may be a movable, centralized cooling apparatus that supplies cooling air more intensively to equipment in a section where a hot spot is locally generated, for example, a service room.

The cooling air supplying booth 100 contains a main frame 110 and a plurality of plates. The main frame 110 is formed of edges of a cuboid. The plates are fixed to the main frame 110 and are disposed at four of sides of the cuboid to form a path 112 inside the cuboid through which cooling air moves. The plates include a front side plate 121, a right side plate 122, a left side plate 123, and an upper side plate 124. The main frame 110 is made preferably of aluminum material, and the plates are made preferably of thermoplastic material sold under the trademark LEXAN, for example.

Cooling air is supplied to the path 112 through a cooling plate 125 provided at the opposite end of the frame 110 from the upper side plate 124. Cooling air is supplied to the equipment to be cooled through an outlet side 114 on the frame 119, opposite the front side plate 121. In one embodiment of the inventive concept the cooling plate 125 includes four fans 130, although more or less than four may also be provided. The four fans 130 are used to generate cooling air supplied to the path 112 for moving the cooling air more smoothly. The area or the dimensions of the outlet side 114 preferably and substantially correspond to the size of a rack where pieces of equipment are disposed in a service room. For example, the cooling air supplying booth 100 is configured such that the outlet side 114 faces the rack and substantially matches the size of the rack 200. Thus, cooling air of cold aisle is directly supplied to the equipment, and not dispersed.

Components that will be described may be selectively included in the cooling air supplying booth 100 if need arises.

The cooling air supplying booth 100 further includes a pair of support frames 140 spaced substantially evenly between the upper side plate 124 and the cooling plate 125. Each of the support frames 140 includes three connected sections, each of which are fixed respectively to a corresponding left side plate 123, the front side plate 121 and the right side plate 122. The ends of each of the three sections are fixed to the main frame 110.

The cooling air supplying booth 100 further includes a pair of temperature sensors 150, although more or less than two may also be provided. The temperature sensors 150 may be attached to the main frame 110 or at least one support frame 140 to be stationary. FIG. 1 shows the temperature sensors 150 being attached to the support frame 140 near the upper side plate 124.

The cooling air supplying booth 100 further includes a control unit 160 that is connected to the temperature sensors 150, and operatively receives output signals of the temperature sensors 150. The control unit 160 may have at least one of the functions including the following: a function (module) of displaying information about an inner temperature of the cooling air supplying booth 100, depending on the received output signal from the temperature sensors 150, and a function of controlling the fans 130, depending on the received output signal of the temperature sensors 150. Also, the control unit 160 may have a function of displaying information about the operating states of the fans 130 or changing the control reference value about the fans.

In a preferred embodiment, the control unit 160 is connected to the fans 130 to control the operations of the fans. The control unit 160 is connected to the temperature sensors 150 and the fans 130 through wires or wireless connection for receiving output signals of the temperature sensors or for transmitting control signals to the fans. In one embodiment of the invention, the control unit 160 is fixed to the front side plate 121.

The cooling air supplying booth 100 further includes a pair of handles 170 disposed on the main frame 110 at the front side of the cuboid. The handle 170 is used to improve convenience of movement of the cooling air supplying booth 100.

The cooling air supplying booth 100 further includes four wheels 180 that are attached on the bottom side of the cooling plate 125, on the outside of cooling air supplying booth 100. In FIG. 1, only three wheels 180 are shown because one wheel is not illustrated. However, it is obvious that a wheel 180 is attached on the remaining vertex of the cooling plate 125. These wheels 180 may be selectively included in the cooling air supplying booth 100 to improve convenience of movement of the cooling air supplying booth 100. The wheels 180 may be implemented to have a ball type or a roller type and more or less than four wheels may be employed. However, the scope and spirit of the inventive concept may not be limited thereto.

Figure 2:
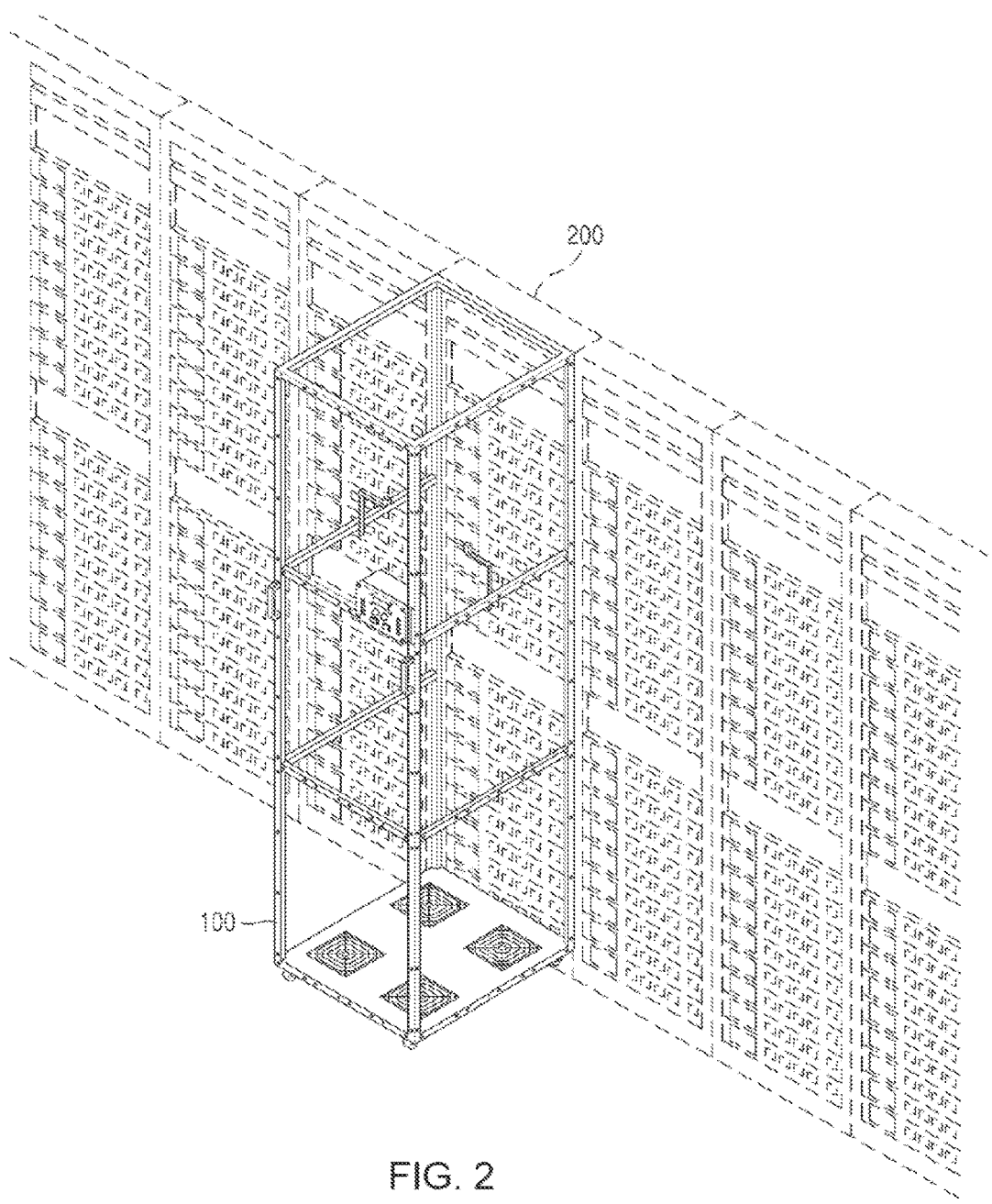
FIG. 2 is a diagram showing a cooling air supplying booth joined to a rack unit, according to an embodiment of the inventive concept.
Figure 3:
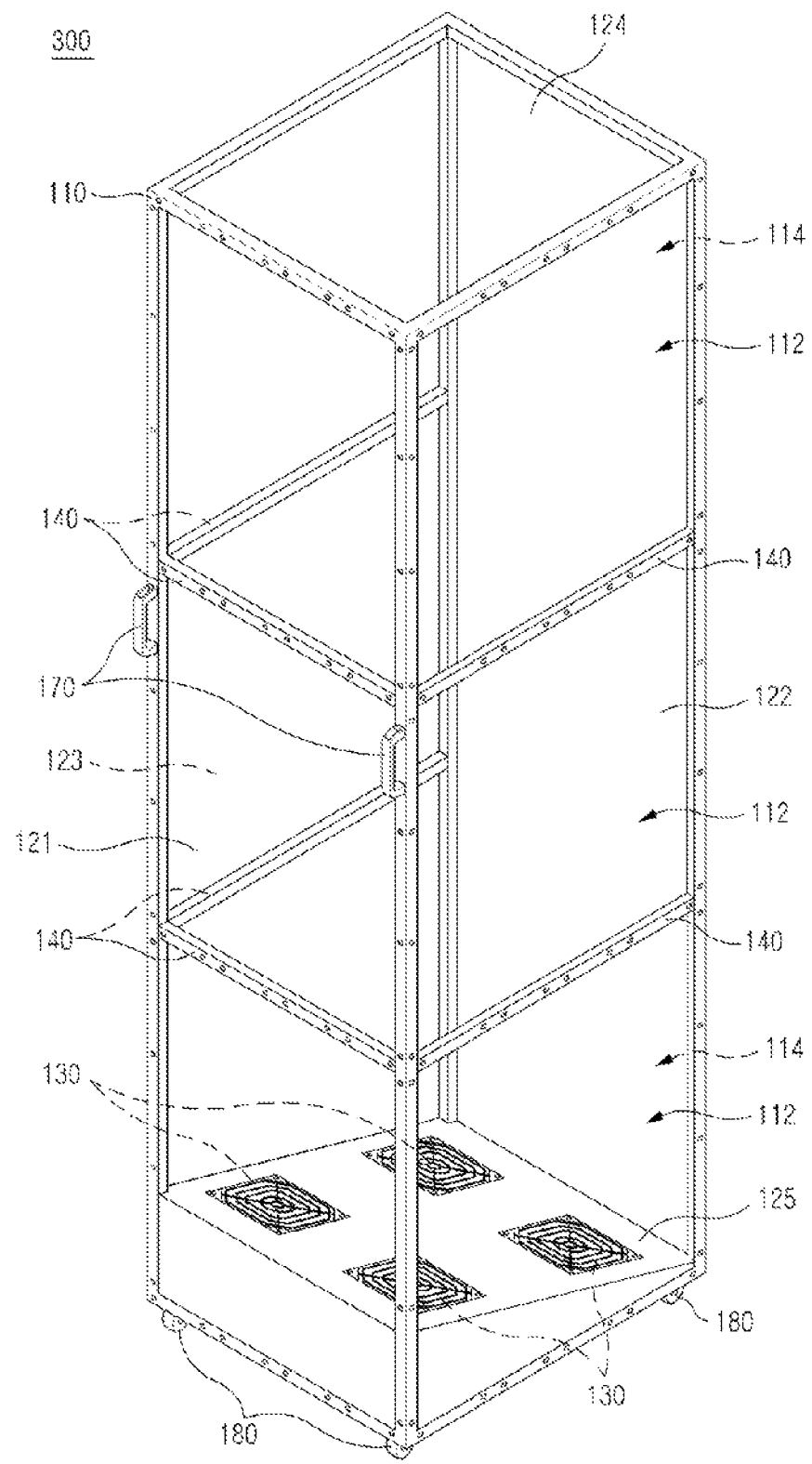
FIG. 3 is a perspective view of a cooling air supplying booth according to another embodiment of the inventive concept.

FIG. 2 is a diagram showing the cooling air supplying booth 100 joined to a rack unit, according to an embodiment of the inventive concept. FIG. 2 shows pieces of equipment divided by the rack unit. In an embodiment of the inventive concept, the cooling air supplying booth 100 is adapted and configured to be joined to one of a plurality of racks 200. In this manner, cooling air is supplied directly to the pieces of equipment divided by the rack unit through a cooling air supplying path 112 that the cooling air supplying booth 100 forms FIG. 3 is a perspective view of a cooling air supplying booth according to another embodiment of the inventive concept. A cooling air supplying booth 300 shown in FIG. 3 includes components that are the same as those described with reference to FIG. 1. Even though a temperature sensor and a control unit are not illustrated in FIG. 3, components, such as a temperature sensor, a control unit, support frames, a knob, and wheels, may be selectively included in the cooling air supplying booth 300 if need arises.

Unlike the cooling air supplying booth 100, the cooling air supplying booth 300 contains a cooling plate 125 that is inclined with at a predetermined angle. In an embodiment of the inventive concept the cooling plate 125 is inclined toward the first side plate 121 from the outlet side 114 of the cooling air supplying booth 300 by as much as about 15°. The cooling plate 125 is inclined by such that cooling air supplied through fans 130 included in the cooling plate 125 is supplied to the pieces of equipment of a rack unit more efficiently.

The cooling plate 125 is fixed to the cooling air supplying booth 300 in various ways such that the cooling plate 125 is inclined. In an exemplary embodiment, the cooling plate 125 is fixed to the cooling air supplying booth 300 by securing an edge facing the front side plate 121 to the first front side plate 121 or to a portion of the main frame 110 at the front side plate 121. In another exemplary embodiment, the cooling plate 125 is fixed to the cooling air supplying booth 300 by securing an edge facing the outlet side 114 of the cooling air supplying booth 300 to the main frame 110. In still other exemplary embodiments, a fixing plate (not shown) having a predetermined slope with respect to the cooling plate 125 may be formed at an edge facing the front side plate 121. In this case, the cooling plate 125 is fixed to the cooling air supplying booth 300 as the fixing plate is fixed with the front side plate 121 or the first frame 110.

Figure 4:
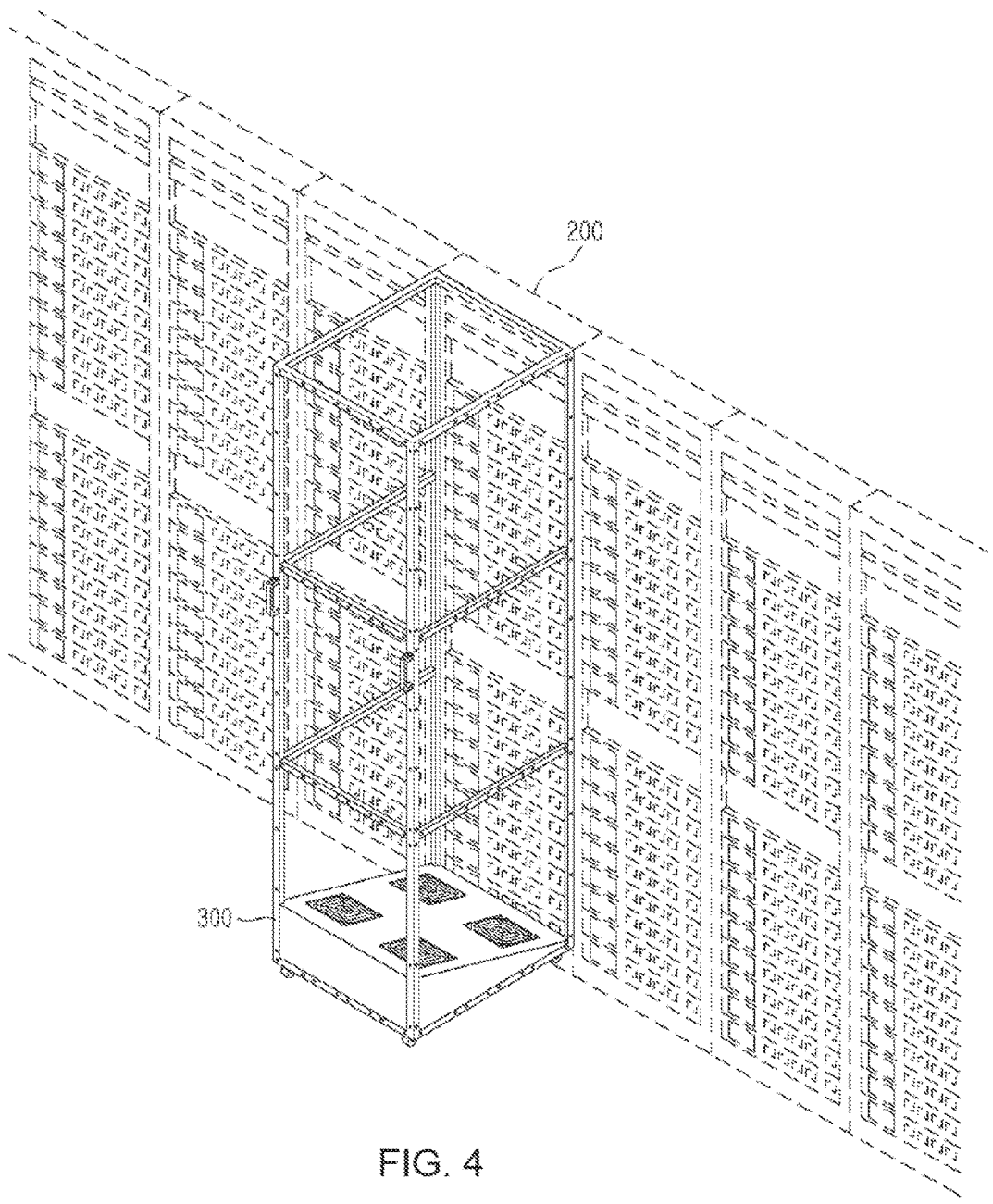
FIG. 4 is a diagram showing a cooling air supplying booth joined to a rack unit, according to another embodiment of the inventive concept.

FIG. 4 is a diagram showing a cooling air supplying booth joined to a rack unit, according to another embodiment of the inventive concept. In FIG. 4, the cooling air supplying booth 300 described with reference to FIG. 3 is joined with the rack 200 described with reference to FIG. 2. Cooling air supplied to the cooling air supplying path 112 from the fans 130 of the cooling air supplying booth 300 may be supplied to the pieces of equipment of the rack 200 more efficiently.

With the above description, a cooling air supplying booth may be joined to a rack such that cooling air is directly supplied to the target equipment. Thus, it is possible to cool pieces of equipment through the cooling air supplying booth more efficiently. Also, it is possible to improve cooling performance using fans with respect to a section where heat is generated locally and intensively, to check current operating states of fans, and to control fans efficiently using a function capable of controlling fan control reference values.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A cooling air supplying apparatus for cooling heat generating equipment housed in a plurality of equipment racks separate from the cooling air supplying apparatus, comprising:
   a booth having
      a rigid cuboid frame including a top side, a bottom side and four vertical sides between the top side and the bottom side;
      at least one support frame provided between the top side and the bottom side and extending along only three of the four vertical sides of the cuboid frame;
      a top plate attached to the top side and a side plate attached to each of the three vertical sides on which the at least one support frame is provided,
      wherein the top plate and the side plates define a boundary between an outside and an inside of the booth and form an air moving path inside the booth for moving cooling air through the booth and discharging the cooling air through a cooling air outlet side defined by the vertical side on which the side plate is not attached and the at least one support frame is not provided; and
   a cooling plate attached to the bottom side of the cuboid frame and having at least one fan for supplying the cooling air from the outside the booth into the inside the booth;
   a plurality of wheels attached to the bottom side of the cuboid frame;
   at least one temperature sensor attached to the at least one support frame inside the booth, and
   a controller unit attached to a select one of the side plates and communicatively connected to the at least one temperature sensor and the at least one fan on the cooling plate, for displaying a temperature inside the booth and controlling the at least one fan;
   wherein the booth is movable to a select one of the equipment racks housing the heat generating equipment, and the cooling air outlet side physically joins to the select one of the equipment racks that houses the heat generating equipment and supplies the cooling air discharged from the booth through the cooling air outlet side into the select one of equipment racks during a time the heat generating equipment is operational in the select one of the equipment racks, and
   wherein the cooling plate is inclined to be lower at the cooling air outlet side at a predetermined angle with respect to a floor where the booth is arranged such that the cooling air generated from the at least one fan is led toward the cooling air outlet side.

2. The cooling air supplying apparatus of claim 1, wherein a size and a shape of the cooling air outlet side substantially correspond to a portion of the select one of the equipment racks to which the cooling air outlet side is joined.

3. The cooling air supplying apparatus of claim 1, wherein the cooling air supplied to the select one of the equipment racks is supplied through the select one of the equipment racks to a service room in which the select one of the equipment racks is placed.

* * * * *